United States Patent
Wang et al.

(10) Patent No.: US 11,030,931 B2
(45) Date of Patent: Jun. 8, 2021

(54) SHIFT REGISTER UNIT, DRIVING METHOD, GATE DRIVE CIRCUIT AND DISPLAY DEVICE

(71) Applicants: Hefei BOE Optoelectronics Technology Co., Ltd., Anhui (CN); BOE Technology Group Co., Ltd., Beijing (CN)

(72) Inventors: Ying Wang, Beijing (CN); Meng Li, Beijing (CN); Hongmin Li, Beijing (CN)

(73) Assignees: HEFEI BOE OPTOELECTRONICS TECHNOLOGY CO., LTD., Hefei (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/546,470

(22) Filed: Aug. 21, 2019

(65) Prior Publication Data

US 2020/0211435 A1    Jul. 2, 2020

(30) Foreign Application Priority Data

Jan. 2, 2019  (CN) .......................... 201910001669.5

(51) Int. Cl.
   *G09G 3/20* (2006.01)
   *G11C 19/28* (2006.01)

(52) U.S. Cl.
   CPC .............. *G09G 3/20* (2013.01); *G11C 19/28* (2013.01); *G09G 2310/0267* (2013.01); *G09G 2310/0286* (2013.01); *G09G 2330/02* (2013.01)

(58) Field of Classification Search
   CPC ............ G09G 3/20; G09G 2310/0267; G09G 2310/0286; G09G 2330/02; G11C 19/28
   See application file for complete search history.

(56) References Cited

U.S. PATENT DOCUMENTS

| | | | |
|---|---|---|---|
| 10,062,323 B2* | 8/2018 | Cho | G09G 3/3266 |
| 10,204,544 B2* | 2/2019 | Kim | G09G 3/2092 |
| 10,217,428 B2* | 2/2019 | Fan | G11C 19/28 |
| 2008/0055225 A1* | 3/2008 | Pak | G09G 3/3677 |
| | | | 345/96 |

(Continued)

FOREIGN PATENT DOCUMENTS

| CN | 104282285 A | 1/2015 |
|---|---|---|
| CN | 105761757 A | 7/2016 |

(Continued)

OTHER PUBLICATIONS

First office action of Chinese application No. 201910001669.5 dated Sep. 3, 2020.

*Primary Examiner* — Sejoon Ahn
(74) *Attorney, Agent, or Firm* — Fay Sharpe LLP

(57) ABSTRACT

Provided are a shift register unit, a driving method, a gate drive circuit and a display device in the field of display technology. The shift register unit includes an input circuit, an output circuit, and a first pull-down circuit. The output circuit is coupled to a first clock signal terminal, a first node, a first DC power supply terminal, and a first output terminal respectively, and configured to output a first power supply signal from the first DC power supply terminal to the first output terminal in response to a potential of the first node and a first clock signal provided by the first clock signal terminal.

20 Claims, 8 Drawing Sheets

(56) References Cited

U.S. PATENT DOCUMENTS

| | | | |
|---|---|---|---|
| 2008/0100560 A1* | 5/2008 | Na | G09G 3/3677 |
| | | | 345/101 |
| 2009/0009497 A1 | 1/2009 | Lee et al. | |
| 2009/0128476 A1* | 5/2009 | Lee | G09G 3/3677 |
| | | | 345/98 |
| 2010/0245298 A1* | 9/2010 | Chen | G09G 3/3677 |
| | | | 345/204 |
| 2014/0119491 A1* | 5/2014 | Liu | G11C 19/28 |
| | | | 377/64 |
| 2014/0125648 A1* | 5/2014 | Chung | H03K 17/08122 |
| | | | 345/213 |
| 2017/0221441 A1* | 8/2017 | Gu | G06F 3/044 |
| 2017/0249893 A1 | 8/2017 | Kim et al. | |
| 2018/0240408 A1 | 8/2018 | Ma | |
| 2018/0301100 A1 | 10/2018 | Li et al. | |
| 2019/0304559 A1 | 10/2019 | Wang | |
| 2020/0075113 A1 | 3/2020 | Yuan et al. | |
| 2020/0273419 A1 | 8/2020 | Wang et al. | |

FOREIGN PATENT DOCUMENTS

| | | | |
|---|---|---|---|
| CN | 106847225 A | | 6/2017 |
| CN | 108281124 A | | 7/2018 |
| CN | 108288451 A | | 7/2018 |
| CN | 108428425 A | | 8/2018 |
| CN | 108564910 A | | 9/2018 |
| CN | 108648705 A | | 10/2018 |
| CN | 108665865 A | | 10/2018 |
| CN | 108877636 A | | 11/2018 |

\* cited by examiner

SHIFT REGISTER UNIT, DRIVING METHOD, GATE DRIVE CIRCUIT AND DISPLAY DEVICE

CROSS-REFERENCE TO RELATED APPLICATION

This application claims priority to Chinese Patent Application No.: 201910001669.5, filed on Jan. 2, 2019 and entitled "SHIFT REGISTER UNIT, DRIVING METHOD, GATE DRIVE CIRCUIT AND DISPLAY DEVICE", the entire contents of which are incorporated herein by reference.

TECHNICAL FIELD

The present disclosure relates to the field of display technology, and particularly to a shift register unit, a driving method, a gate drive circuit and a display device.

BACKGROUND

A shift register generally includes a plurality of cascaded shift register units. Each shift register unit is configured to drive a row of pixel units. The plurality of cascaded shift register units can implement scanning and driving of rows of pixels in the display device row by row, to display an image.

In the related art, the shift register unit mainly includes: an input circuit, an output circuit, a reset circuit, and a pull-down circuit. The output circuit is coupled to a pull-up node, a clock signal terminal and an output terminal respectively. The output circuit may output a clock signal from a clock signal terminal to an output terminal under the control of the pull-up node.

SUMMARY

The present disclosure provides a shift register unit, a driving method, a gate drive circuit and a display device. The technical solutions are as follows.

In an aspect, there is provided a shift register unit. The shift register unit comprises: an input circuit, an output circuit, and a first pull-down circuit; wherein the input circuit is coupled to an input signal terminal and a first node respectively, and the input circuit is configured to output an input signal from the input signal terminal to the first node; the output circuit is coupled to a first clock signal terminal, the first node, a first DC power supply terminal and a first output terminal respectively, and the output circuit is configured to output a first power supply signal from the first DC power supply terminal to the first output terminal in response to a potential of the first node and a first clock signal provided by the first clock signal terminal; and the first pull-down circuit is coupled to a first control signal terminal, a second DC power supply terminal, the first output terminal, and the first node respectively, and the first pull-down circuit is configured to output a second power supply signal from the second DC power supply terminal to the first output terminal and the first node respectively in response to a first control signal provided by the first control signal terminal.

Optionally, the output circuit comprises: an adjusting sub-circuit and an output sub-circuit; wherein the adjusting sub-circuit is coupled to the first clock signal terminal, the first output terminal, the first node and a second node respectively, and the adjusting sub-circuit is configured to adjust the potential of the first node according to a potential of the first output terminal, and adjust a potential of the second node according to the potential of the first node in response to the first clock signal; and the output sub-circuit is coupled to the second node, the first DC power supply terminal and the first output terminal respectively, and the output sub-circuit is configured to output the first power supply signal to the first output terminal in response to a potential of the second node.

Optionally, the adjusting sub-circuit comprises: a switching transistor and a capacitor; wherein a gate of the switching transistor is coupled to the first clock signal terminal, a first electrode of the switching transistor is coupled to the first node, and a second electrode of the switching transistor is coupled to the second node; and one terminal of the capacitor is coupled to the first node, and an other terminal of the capacitor is coupled to the first output terminal.

Optionally, the output sub-circuit comprises: a first output transistor; wherein a gate of the first output transistor is coupled to the second node, a first electrode of the first output transistor is coupled to the first DC power supply terminal, and a second electrode of the first output transistor is coupled to the first output terminal.

Optionally, the output circuit is further coupled to a second output terminal, and the output sub-circuit further comprises: a second output transistor; wherein a gate of the second output transistor is coupled to the second node, a first electrode of the second output transistor is coupled to the first DC power supply terminal, and a second electrode of the second output transistor is coupled to the second output terminal.

Optionally, a width-to-length ratio of a conductive channel of a transistor in the output sub-circuit is three to five times width-to-length ratios of conductive channels of transistors in the input circuit, the adjusting sub-circuit and the first pull-down circuit.

Optionally, the first pull-down circuit comprises: a first pull-down transistor and a second pull-down transistor; wherein a gate of the first pull-down transistor and a gate of the second pull-down transistor are both coupled to the first control signal terminal; a first electrode of the first pull-down transistor and a first electrode of the second pull-down transistor are both coupled to the second DC power supply terminal; and a second electrode of the first pull-down transistor is coupled to the first node, and a second electrode of the second pull-down transistor is coupled to the first output terminal.

Optionally, the first pull-down circuit is further coupled to the second node, and the first pull-down circuit is further configured to output the second power supply signal to the second node in response to the first control signal.

Optionally, the output sub-circuit is further coupled to a second output terminal; the first pull-down circuit comprises: a first pull-down transistor, a second pull-down transistor, a third pull-down transistor and a fourth pull-down transistor; wherein a gate of the first pull-down transistor, a gate of the second pull-down transistor, a gate of the third pull-down transistor, and a gate of the fourth pull-down transistor are all coupled to the first control signal terminal; a first electrode of the first pull-down transistor, a first electrode of the second pull-down transistor, a first electrode of the third pull-down transistor, and a first electrode of the fourth pull-down transistor are all coupled to the second DC power supply terminal; and a second electrode of the first pull-down transistor is coupled to the first node, a second electrode of the second pull-down transistor is coupled to the first output terminal, a second electrode of the third pull-down transistor is coupled to the second node, and a second electrode of the fourth pull-down transistor is coupled to the second output terminal.

Optionally, the input circuit comprises: a first input sub-circuit and a second input sub-circuit; wherein the first input sub-circuit is coupled to the input signal terminal and a third node respectively, and the first input sub-circuit is configured to output the input signal to the third node in response to the input signal from the input signal terminal; and the second input sub-circuit is coupled to the third node and the first node respectively, and the second input sub-circuit is configured to output a potential of the third node to the first node in response to the potential of the third node.

Optionally, the first input sub-circuit comprises: a first input transistor; and the second input sub-circuit comprises: a second input transistor; wherein a gate and a first electrode of the first input transistor are both coupled to the input signal terminal, and a second electrode of the first input transistor is coupled to the third node; and a gate and a first electrode of the second input transistor are both coupled to the third node, and a second electrode of the second input transistor is coupled to the first node.

Optionally, the shift register unit further comprises: a second pull-down circuit; wherein the second pull-down circuit is coupled to the first clock signal terminal, the second DC power supply terminal, and the third node respectively, and the second pull-down circuit is configured to output the second power supply signal to the third node in response to the first clock signal.

Optionally, the second pull-down circuit comprises: a fifth pull-down transistor; wherein a gate of the fifth pull-down transistor is coupled to the first clock signal terminal, a first electrode of the fifth pull-down transistor is coupled to the second DC power supply terminal, and a second electrode of the fifth pull-down transistor is coupled to the third node.

Optionally, the input circuit is further coupled to a second control signal terminal, and the input circuit is configured to output the input signal to the first node in response to a second control signal provided by the second control signal terminal; the shift register unit further comprises: a third pull-down circuit; wherein the third pull-down circuit is coupled to the second control signal terminal, the second DC power supply terminal, and the first output terminal respectively; and the third pull-down circuit is configured to output the second power supply signal to the first output terminal in response to the second control signal.

Optionally, the output circuit is further coupled to a second output terminal; and the third pull-down circuit comprises: a sixth pull-down transistor and a seventh pull-down transistor; wherein a gate of the sixth pull-down transistor and a gate of the seventh pull-down transistor are both coupled to the second control signal terminal; a first electrode of the sixth pull-down transistor and a first electrode of the seventh pull-down transistor are both coupled to the second DC power supply terminal; and a second electrode of the sixth pull-down transistor is coupled to the first output terminal, and a second electrode of the seventh pull-down transistor is coupled to the second output terminal.

Optionally, transistors in the input circuit, the adjusting sub-circuit, the output sub-circuit, and the first pull-down circuit are all N-type transistors.

Optionally, the first control signal terminal is a second clock signal terminal, and the second control signal terminal is a third clock signal terminal.

In another aspect, there is provided a method for driving a shift register unit. The method is applied to drive the shift register unit in the above aspect. The method comprises: in an input stage during which a potential of an input signal provided by an input signal terminal is a first potential, outputting, by an input circuit, the input signal to a first node in response to the input signal; in an output stage during which a potential of a first clock signal provided by a first clock signal terminal is a first potential and the potential of the first node maintains the first potential, outputting, by an output circuit, a first power supply signal from a first DC power supply terminal to the first output terminal in response to the potential of the first node and the first clock signal; and in a pull-down stage during which a potential of a first control signal provided by a first control signal terminal is a first potential, outputting, by a first pull-down circuit, a second power supply signal from a second DC power supply terminal to the first node and the first output terminal respectively in response to the first control signal.

In yet another aspect, there is provided a gate drive circuit. The gate drive circuit comprises: at least two cascaded shift register units as described in the above aspect. A first output terminal of each level of shift register unit is coupled to an input signal terminal of a next level of shift register unit, and a second output terminal of each level of shift register unit is coupled to a gate line.

In still yet another aspect, there is provided a display device, comprising: the gate drive circuit in the above aspect.

BRIEF DESCRIPTION OF THE DRAWINGS

In order to describe the technical solutions in the embodiments of the present more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

Figure 1:
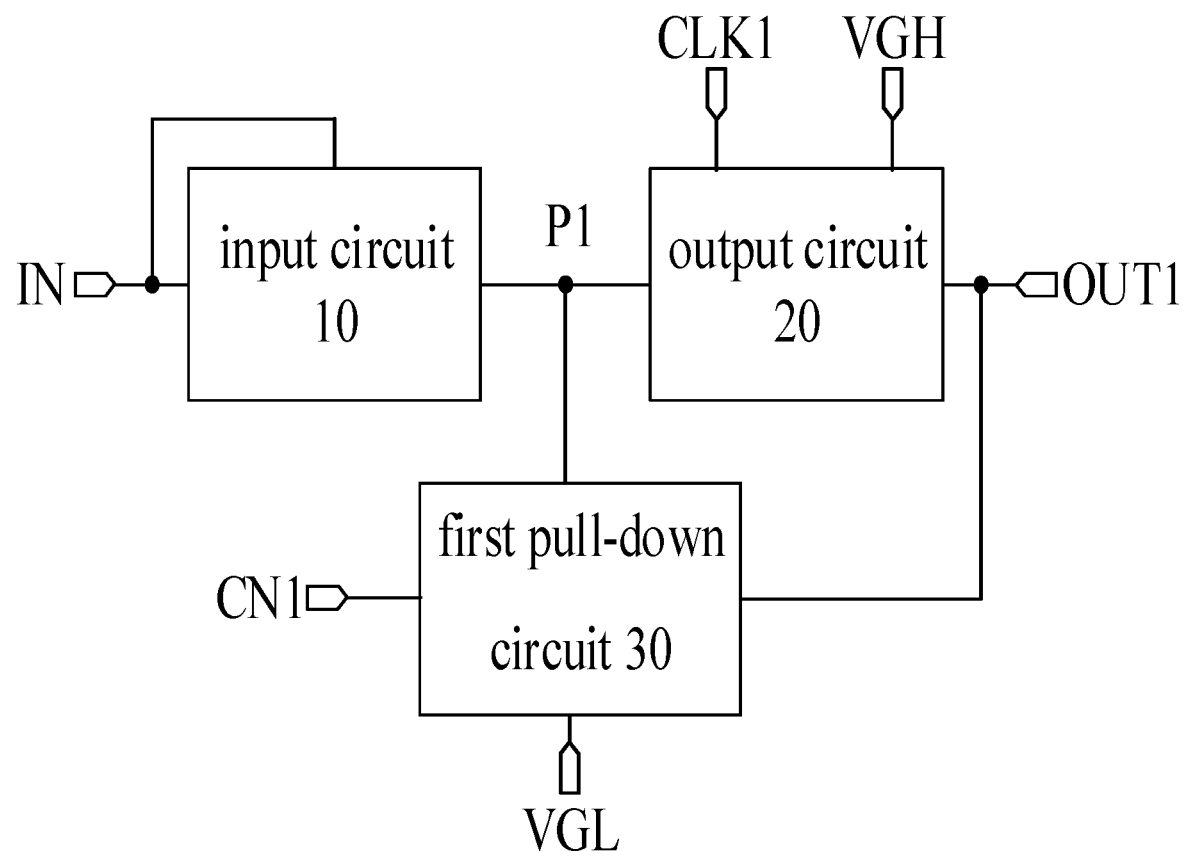
FIG. 1 is a schematic structural diagram of a shift register unit according to an embodiment of the present disclosure.

The embodiments of the present disclosure will be described in further detail with reference to the accompanying drawings, to present the objects, technical solutions, and advantages of the present disclosure more clearly.

Transistors adopted in all the embodiments of the present disclosure may be thin-film transistors or field-effect transistors or other devices having the same property. According to the function in a circuit, the transistors adopted in the embodiments of the present disclosure are generally switching transistors. Since the source and the drain of a switching transistor adopted herein are symmetric, the source and drain may be exchanged. In the embodiments of the present disclosure, the source is referred to as a first electrode and the drain is referred to as a second electrode. Alternatively, the drain may be referred to as a first electrode and the source may be referred to as a second electrode. According to form in the drawings, it is specified that a middle terminal of a transistor is the gate, a signal input terminal is the source, and a signal output terminal is the drain. In addition, the switching transistors adopted in the embodiments of the present disclosure may include any of P-type switching transistors and N-type switching transistors. The P-type switching transistor is turned on when the gate is at a low level, and is turned off when the gate is at a high level. The N-type switching transistor is turned on when the gate is at a high level, and is turned off when the gate is at a low level. Additionally, in various embodiments of the present disclosure, each of a plurality of signals has a first potential and a second potential. The first potential and the second potential only indicate that the potential of the signal has two different state quantities, instead of indicating that the first potential or the second potential herein in this specification has a specific value.

FIG. 1 is a schematic structural diagram of a shift register unit according to an embodiment of the present disclosure. As shown in FIG. 1, the shift register unit may include an input circuit 10, an output circuit 20, and a first pull-down circuit 30.

The input circuit 10 may be coupled to an input signal terminal IN and a first node P1 respectively. The input circuit 10 may output an input signal from the input signal terminal IN to the first node P1.

Exemplarily, the input circuit 10 may output the input signal to the first node P1 when the potential of the input signal provided by the input signal terminal IN is a first potential. In the embodiments of the present disclosure, the first potential may be an effective potential.

The output circuit 20 may be coupled to a first clock signal terminal CLK1, the first node P1, a first DC power supply terminal VGH, and a first output terminal OUT1 respectively. The output circuit 20 may output a first power supply signal from the first DC power supply terminal VGH to the first output terminal OUT1 in response to the potential of the first node P1 and a first clock signal provided by the first clock signal terminal CLK1.

Here, the first output terminal OUT1 may be coupled to the input signal terminal IN of a next level of shift register unit and a gate line, respectively. Correspondingly, the first output terminal OUT1 may be configured to control the operating state of the next level of shift register unit, and may be configured to provide a gate drive signal for the pixel coupled to the gate line.

Exemplarily, the output circuit 20 may output the first power supply signal from the first DC power supply terminal VGH to the first output terminal OUT1 when the potential of the first node P1 is the first potential and the potential of the first clock signal provided by the first clock signal terminal CLK1 is the first potential. The first power supply signal may be a DC signal, and the potential thereof may be the first potential.

Referring to FIG. 1, the first pull-down circuit 30 may be coupled to a first control signal terminal CN1, a second DC power supply terminal VGL, the first output terminal OUT1, and the first node P1 respectively. The first pull-down circuit 30 may output a second power supply signal from the second DC power supply terminal VGL to the first output terminal OUT1 and the first node P1 in response to the first control signal provided by the first control signal terminal CN1.

Exemplarily, the first pull-down circuit 30 may output the second power supply signal from the second DC power supply terminal VGL to the first output terminal OUT1 and the first node P1 when the potential of the first control signal is the first potential. The potential of the second power supply signal is a second potential, thereby achieving noise reduction for the first output terminal OUT1 and the first node P1. In the embodiments of the present disclosure, the second potential may be an ineffective potential, and the second potential may be a low potential relative to the first potential.

In the embodiments of the present disclosure, the equivalent calculation formula for the power consumption P generated by the shift register unit may meet:

$$P \propto 2 \times (C1+C2) \times V^2 \times F \qquad \text{Formula (1).}$$

Here, C1 is the parasitic capacitance of an output transistor in the output circuit 20, C2 is the parasitic capacitance generated between a power supply terminal coupled to the output transistor and other power supply terminals in the shift register unit, V is the voltage of the power supply signal provided by the power supply terminal coupled to the output transistor, and F is the signal frequency of the power supply signal provided by the power supply terminal coupled to the output transistor. According to the above Formula (1), it can be known that the power consumption generated by the shift register unit is directly proportional to C1, C2, V and F. That is, the larger C1, C2, V and F are, the greater the power consumption generated by the shift register unit is; and the smaller C1, C2, V, and F are, the smaller the power consumption generated by the shift register unit is.

The power supply terminal coupled to the output circuit 20 in the shift register unit provided in the embodiment of the present disclosure is the first DC power supply terminal VGH, and the signal output by the output circuit 20 to the first output terminal OUT1 is the first power supply signal provided by the first DC power supply terminal VGH. The power supply signal provided by the DC power supply terminal is a DC signal, and the signal frequency of the DC signal is 0, that is, the signal frequency F of the first power supply signal provided by the first DC power supply terminal VGH is 0. Therefore, by coupling the output circuit 20 to the first DC power supply terminal VGH, the power consumption generated by the shift register unit can be prevented from being affected by the signal frequency F of the power supply signal, thereby effectively reducing the power consumption generated by the shift register unit.

In summary, the embodiment of the present disclosure provides a shift register unit. The shift register unit includes an input circuit, an output circuit, and a first pull-down circuit. The output circuit is coupled to the first DC power supply terminal, and the signal output by the output circuit to the output terminal is the first power supply signal provided by the first DC power supply terminal. As the signal frequency of the first power supply signal provided by the first DC power supply terminal is 0, and the power consumption generated by the shift register unit is directly proportional to the frequency of the signal output by the output circuit to the output terminal, the power consumption generated by the shift register unit can be effectively reduced by coupling the output circuit to the first DC power supply terminal.

Figure 2:
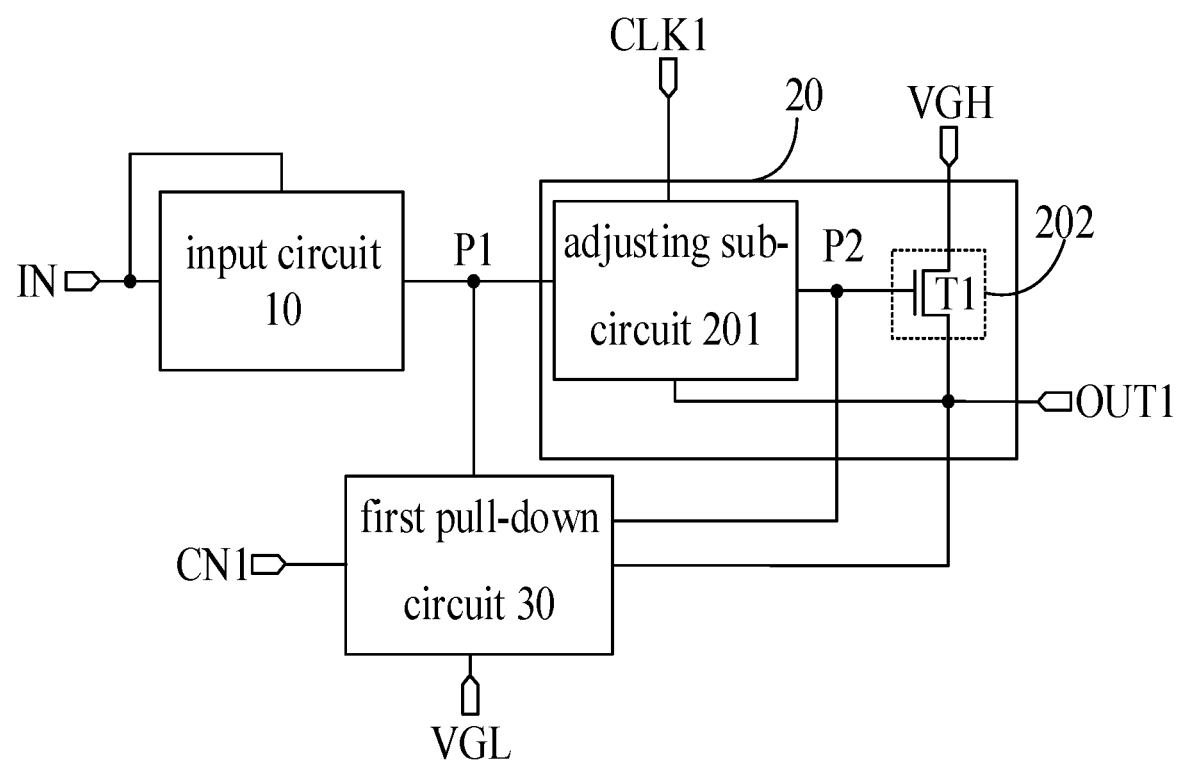
FIG. 2 is a schematic structural diagram of another shift register unit according to an embodiment of the present disclosure.

FIG. 2 is a schematic structural diagram of another shift register unit according to an embodiment of the present disclosure. As shown in FIG. 2, the output circuit 20 may include an adjusting sub-circuit 201 and an output sub-circuit 202.

The adjusting sub-circuit 201 may be coupled to the first clock signal terminal CLK1, the first output terminal OUT1, the first node P1, and the second node P2 respectively. The adjusting sub-circuit 201 may adjust the potential of the first node P1 according to the potential of the first output terminal OUT1, and adjust the potential of the second node P2 according to the potential of the first node P1 in response to the first clock signal.

Exemplarily, the adjusting sub-circuit 201 may adjust the potential of the first node P1 according to the potential of the first output terminal OUT1, and adjust the potential of the second node P2 according to the potential of the first node P1 when the potential of the first clock signal is the first potential.

The output sub-circuit 202 may be coupled to the second node P2, the first DC power supply terminal VGH, and the first output terminal OUT1 respectively. The output sub-circuit 202 may output a first power supply signal to the first output terminal OUT1 in response to the potential of the second node P2.

Exemplarily, the output sub-circuit 202 may output the first power supply signal at the first potential to the first output terminal OUT1 when the potential of the second node P2 is the first potential.

In the embodiment of the present disclosure, the adjusting sub-circuit 201 can output the potential of the first node P1 to the second node P2 when the potential of the first clock signal is the first potential, so that the output sub-circuit 202 can output the first power supply signal at the first potential to the first output terminal OUT1 under the control of the second node P2. Therefore, the adjusting sub-circuit 201 can further pull up the potential of the first node P1 according to the potential of the first output terminal OUT1, thereby further pulling up the potential of the second node P2. Correspondingly, the output sub-circuit 202 can be fully turned on under the control of the potential of the second node P2, so that the output sub-circuit 202 can output the first power supply signal provided by the first DC power supply terminal VGH to the first output terminal OUT1 in a rail-to-rail manner (i.e., full swing amplitude), thereby ensuring the operating reliability of the shift register unit.

Correspondingly, as shown in FIG. 2, in the embodiment of the present disclosure, the first pull-down circuit 30 may further be coupled to the second node P2. The first pull-down circuit 30 may further output a second power supply signal to the second node P2 in response to the first control signal.

Exemplarily, the first pull-down circuit 30 may output the second power supply signal at the second potential to the second node P2 when the potential of the first control signal is the first potential, thereby implementing noise reduction for the second node P2.

Figure 3:
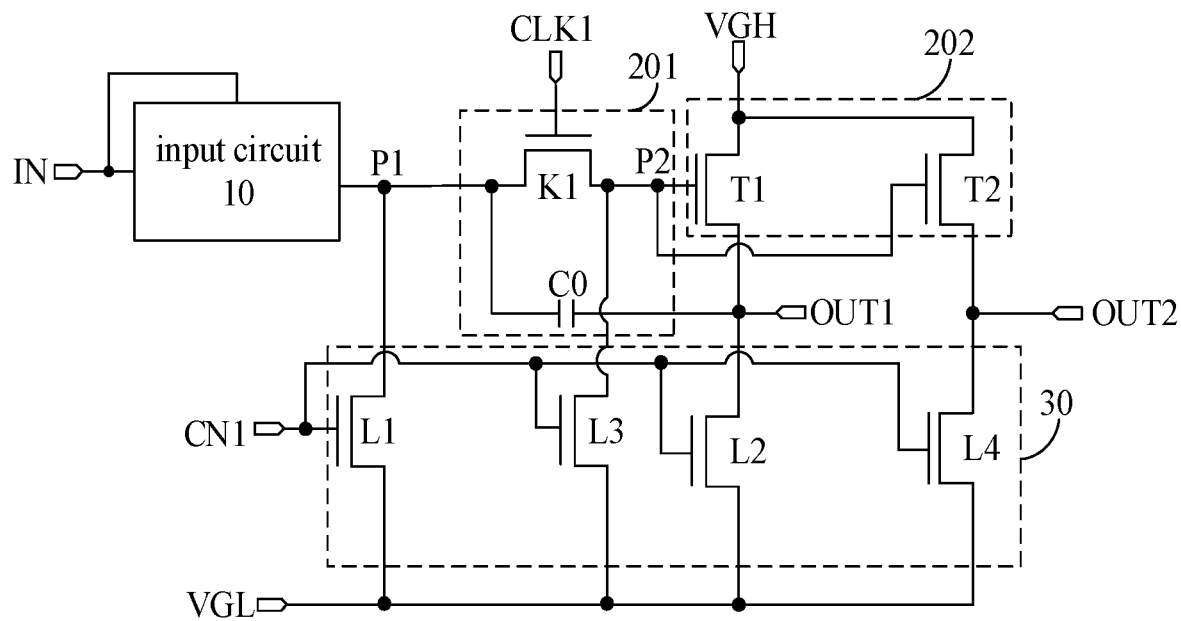
FIG. 3 is a schematic structural diagram of yet another shift register unit according to an embodiment of the present disclosure.

Optionally, FIG. 3 is a schematic structural diagram of yet another shift register unit according to an embodiment of the present disclosure. As shown in FIG. 3, the adjusting sub-circuit 201 may include a switching transistor K1 and a capacitor C0.

The gate of the switching transistor K1 may be coupled to the first clock signal terminal CLK1. The first electrode of the switching transistor K1 may be coupled to the first node P1. The second electrode of the switching transistor K1 may be coupled to the second node P2.

One terminal of the capacitor C0 may be coupled to the first node P1, and the other terminal of the capacitor C0 may be coupled to the first output terminal OUT1.

Optionally, referring to FIG. 2 and FIG. 3, the output sub-circuit 202 may include a first output transistor T1.

The gate of the first output transistor T1 may be coupled to the second node P2. The first electrode of the first output transistor T1 may be coupled to the first DC power supply terminal VGH. The second electrode of the first output transistor T1 may be coupled to the first output terminal OUT1.

Optionally, the output circuit 20 may further be coupled to the second output terminal OUT2. Correspondingly, as shown in FIG. 3, the output sub-circuit 202 may further include: a second output transistor T2.

The gate of the second output transistor T2 may be coupled to the second node P2. The first electrode of the second output transistor T2 may be coupled to the first DC power supply terminal VGH. The second electrode of the second output transistor T2 may be coupled to the second output terminal OUT2.

Here, when the output circuit 20 is further coupled to the second output terminal OUT2, the first output terminal OUT1 coupled to the output circuit 20 may be a shift output terminal, and the second output terminal OUT2 may be a gate signal output terminal. That is, the first output terminal OUT1 may be coupled to the input signal terminal IN of the next level of shift register unit and configured to control the operating state of the next level of shift register unit. The second output terminal OUT2 may be coupled to a gate line and configured to provide a gate drive signal for the pixel coupled to the gate line.

Similarly, the adjusting sub-circuit 201 can pull up the potential of the first node P1 according to the potential of the first output terminal OUT1, thereby pulling up the potential of the second node P2, so that the output sub-circuit 202 is fully turned on under the action of the potential of the second node P2. Therefore, when the potential of the first clock signal is the first potential, the output sub-circuit 202 can further output the first power supply signal provided by the first DC power supply terminal VGH to the second output terminal OUT2 in a full swing amplitude.

Optionally, as shown in FIG. 3, the first pull-down circuit 30 may include: a first pull-down transistor L1 and a second pull-down transistor L2.

The gate of the first pull-down transistor L1 and the gate of the second pull-down transistor L2 may be both coupled to the first control signal terminal CN1. The first electrode of the first pull-down transistor L1 and the first electrode of the second pull-down transistor L2 may be both coupled to the second DC power supply terminal VGL. The second electrode of the first pull-down transistor L1 may be coupled to the first node P1, and the second electrode of the second pull-down transistor L2 may be coupled to the first output terminal OUT1.

Optionally, as shown in FIG. 3, when the output circuit 20 includes the adjusting sub-circuit 201 and the output sub-circuit 202, and the output sub-circuit 202 is further coupled to the second output terminal OUT2, the first pull-down circuit 30 may further include: a third pull-down transistor L3 and a fourth pull-down transistor L4.

The gate of the third pull-down transistor L3 and the gate of the fourth pull-down transistor L4 may be both coupled to the first control signal terminal CN1. The first electrode of the third pull-down transistor L3 and the first electrode of the fourth pull-down transistor L4 may be both coupled to the second DC power supply terminal VGL. The second electrode of the third pull-down transistor L3 may be coupled to the second node P2, and the second electrode of the fourth pull-down transistor L4 may be coupled to the second output terminal OUT2.

The first pull-down transistor L1 may be configured to reduce noise for the first node P1, and the second pull-down transistor L2 may be configured to reduce noise for the first output terminal OUT1. The third pull-down transistor L3 may be can be configured to reduce noise for the second node P2, and the fourth pull-down transistor L4 may be configured to reduce noise for the second output terminal OUT2.

Figure 4:
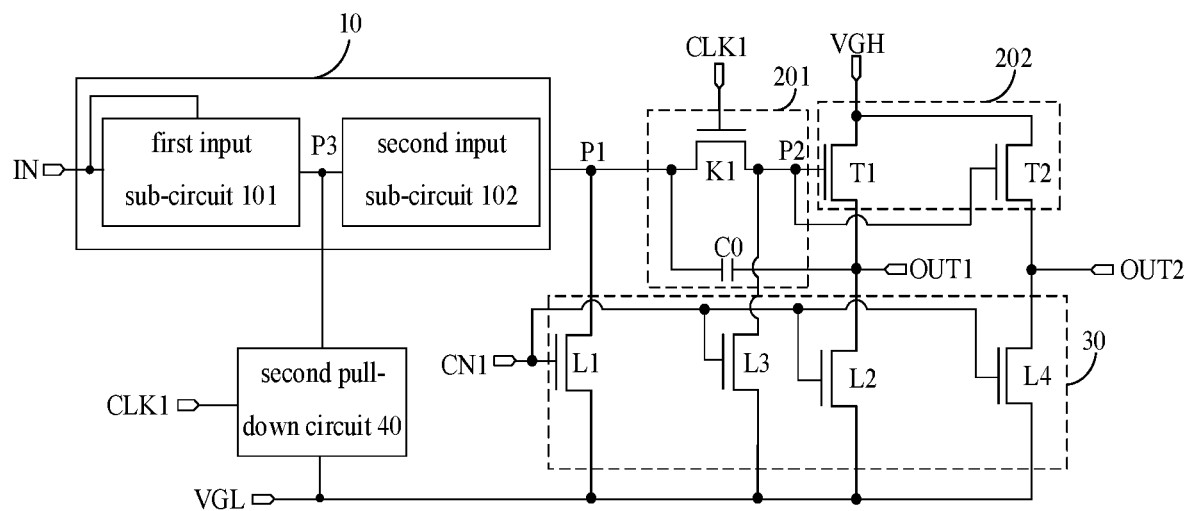
FIG. 4 is a schematic structural diagram of still a further shift register unit according to an embodiment of the present disclosure.

Optionally, FIG. 4 is a schematic structural diagram of still another shift register unit according to an embodiment of the present disclosure. As shown in FIG. 4, the input circuit 10 may include a first input sub-circuit 101 and a second input sub-circuit 102.

The first input sub-circuit 101 may be coupled to the input signal terminal IN and the third node P3 respectively. The first input sub-circuit 101 may output an input signal to the third node P3 in response to the input signal.

Exemplarily, the first input sub-circuit 101 may output the input signal to the third node P3 when the potential of the input signal is the first potential.

The second input sub-circuit 102 may be coupled to the third node P3 and the first node P1 respectively, and the second input sub-circuit 102 may output the potential of the third node P3 to the first node P1 in response to the potential of the third node P3.

Exemplarily, the second input sub-circuit 102 may output the potential of the third node P3 to the first node P1 when the potential of the third node P3 is the first potential.

Figure 5:
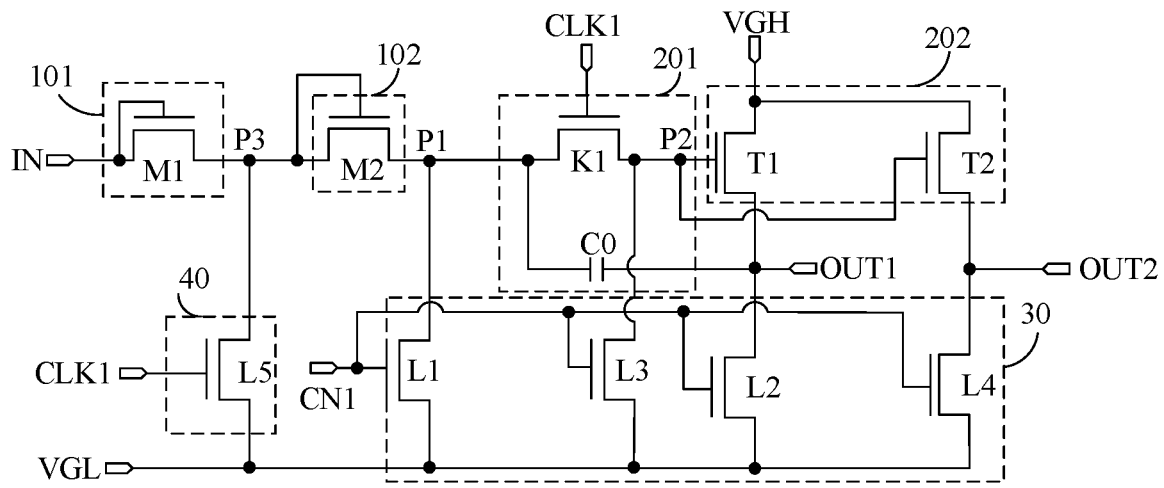
FIG. 5 is a schematic structural diagram of still a further shift register unit according to an embodiment of the present disclosure.

FIG. 5 is a schematic structural diagram of still yet another shift register unit according to an embodiment of the present disclosure. As shown in FIG. 5, the first input sub-circuit 101 may include a first input transistor M1, and the second input sub-circuit 102 may include a second input transistor M2.

The gate and the first electrode of the first input transistor M1 may be both coupled to the input signal terminal IN, and the second electrode of the first input transistor M1 may be coupled to the third node P3.

The gate and the first electrode of the second input transistor M2 may be both coupled to the third node P3, and the second electrode of the second input transistor M2 is coupled to the first node P1.

Optionally, as shown in FIG. 4, the shift register unit may further include: a second pull-down circuit 40.

The second pull-down circuit 40 may be coupled to the first clock signal terminal CLK1, the second DC power source terminal VGL, and the third node P3 respectively.

The second pull-down circuit 40 may output a second power supply signal to the third node P3 in response to the first clock signal.

Exemplarily, the second pull-down circuit 40 may output the second power supply signal at a second potential to the third node P3 when the potential of the first clock signal is the first potential, thereby implementing noise reduction for the third node P3.

In the embodiment of the present disclosure, the second input transistor M2 is in a diode connection manner. Thus, when the first clock signal is at the first potential, that is, when the output circuit 20 operates, the second pull-down circuit 40 outputs the second power supply signal at the second potential to the third node P3, to implement noise reduction for the third node P3. The problem that the potential of the first node P1 flows backward to the third node P3, to cause turn-on of the second input transistor M2 by mistake after the output circuit 20 pulls up the potential of the first node P1 according to the potential of the first output terminal OUT1 can be avoided, thereby ensuring the operating stability of the shift register unit.

Optionally, as shown in FIG. 5, the second pull-down circuit 40 may include a fifth pull-down transistor L5.

The gate of the fifth pull-down transistor L5 may be coupled to the first clock signal terminal CLK1. The first electrode of the fifth pull-down transistor L5 may be coupled to the second DC power source terminal VGL. The second electrode of the fifth pull-down transistor L5 may be coupled to the third node P3.

Figure 6:
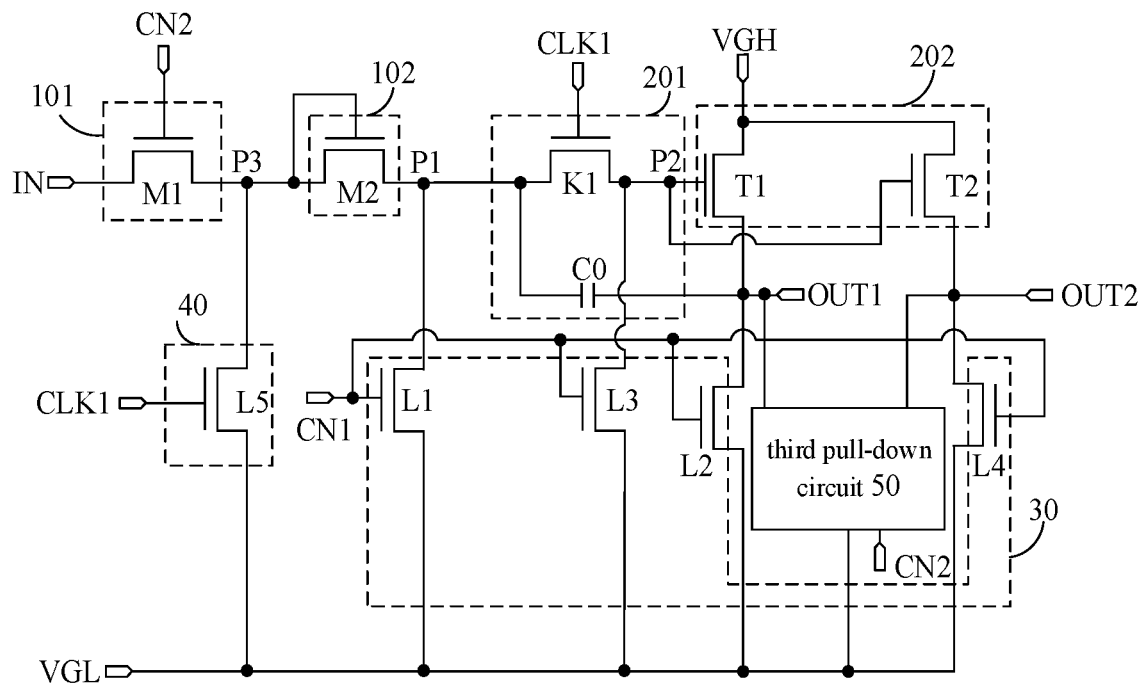
FIG. 6 is a schematic structural diagram of still a further shift register unit according to an embodiment of the present disclosure.

Optionally, FIG. 6 is a schematic structural diagram of still yet another register unit according to an embodiment of the present disclosure. As shown in FIG. 6, the input circuit 10 may further be coupled to a second control signal terminal CN2. Correspondingly, the input circuit 10 my output an input signal to the first node P1 in response to a second control signal provided by the second control signal terminal CN2.

Exemplarily, the input circuit 10 may output the input signal to the first node P1 when the potential of the second control signal is the first potential.

Exemplarily, as shown in FIG. 6, in the solution that the input circuit 10 is further coupled to the second control signal terminal CN2, the gate of the first input transistor M1 may be coupled to the second control signal terminal CN2, the first electrode of the first input transistor M1 may be coupled to the input signal terminal IN, and the second electrode of the first input transistor M1 may be coupled to the third node P3.

Optionally, as shown in FIG. 6, the shift register unit may further include: a third pull-down circuit 50.

The third pull-down circuit 50 may be coupled to the second control signal terminal CN2, the second DC power supply terminal VGL and the first output terminal OUT1 respectively. The third pull-down circuit 50 may output the second power supply signal to the first output terminal OUT1 in response to the second control signal.

Optionally, referring to FIG. 3 to FIG. 5, the output circuit 20 may further be coupled to the second output terminal OUT2. Correspondingly, referring to FIG. 6, the third pull-down circuit 50 may further be coupled to the second output terminal OUT2. The third pull-down circuit 50 may also output the second power supply signal to the second output terminal OUT2 in response to the second control signal.

That is, the third pull-down circuit 50 may perform noise reduction for the first output terminal OUT1 and the second output terminal OUT2 under the control of the second control signal.

The third pull-down circuit 50 may output the second power supply signal at the second potential to the two output terminals respectively when the potential of the second control signal is the first potential. The second potential is an ineffective potential. Therefore, the problem that the potential of the first output terminal OUT1 may change with the potential of the first node P1 when the input circuit 10 outputs the input signal to the first node P1 under the control of the second control signal can be avoided, thereby ensuring the operating stability of the shift register unit.

Figure 7:
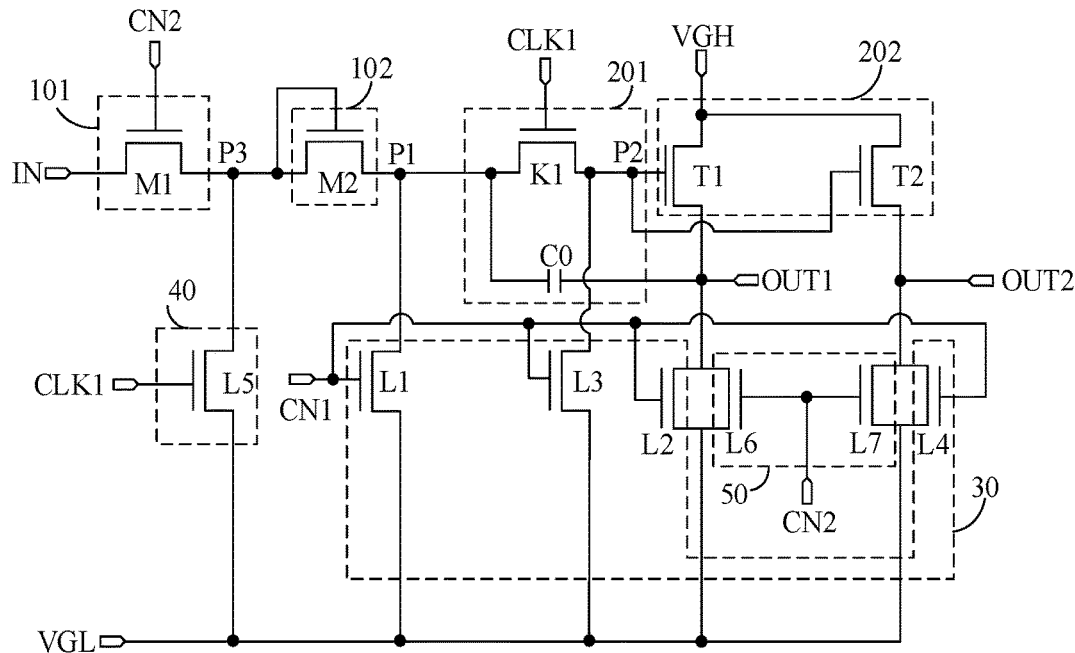
FIG. 7 is a schematic structural diagram of still a further shift register unit according to an embodiment of the present disclosure.

Optionally, FIG. 7 is a schematic structural diagram of still yet another shift register unit according to an embodiment of the present disclosure. As shown in FIG. 7, the third pull-down circuit 50 may include a sixth pull-down transistor L6 and a seventh pull-down transistor L7.

The gate of the sixth pull-down transistor L6 and the gate of the seventh pull-down transistor L7 may be both coupled to the second control signal terminal CN2. The first electrode of the sixth pull-down transistor L6 and the first electrode of the seventh pull-down transistor L7 may be both coupled to the second DC power supply terminal VGL. The second electrode of the sixth pull-down transistor L6 may be coupled to the first output terminal OUT1, and the second electrode of the seventh pull-down transistor L7 may be coupled to the second output terminal OUT2.

The sixth pull-down transistor L6 may be configured to reduce noise for the first output terminal OUT1, and the seventh pull-down transistor L7 may be configured to reduce noise for the second output terminal OUT2.

Optionally, in the embodiments of the present disclosure, the transistors in the input circuit 10, the adjusting sub-circuit 201, the output sub-circuit 202, and the first pull-down circuit 30 may all be N-type transistors. Moreover, the width-to-length ratio of a conductive channel of the output transistor in the output sub-circuit 202 may be three to five times the width-to-length ratios of conductive channels of transistors in the input circuit 10, the adjusting sub-circuit 201, and the first pull-down circuit 30.

Optionally, as shown in FIG. 4 to FIG. 7, the shift register unit may further include a second pull-down circuit 40 and a third pull-down circuit 50. Correspondingly, the transistors in the second pull-down circuit 40 and the third pull-down circuit 50 may also be N-type transistors. Moreover, the width-to-length ratio of the conductive channel of the output transistor in the output sub-circuit 202 may also be three to five times the width-to-length ratios of the conductive channels of the transistors in the second pull-down circuit 40 and the third pull-down circuit 50.

Exemplarily, the width-to-length ratio of the conductive channel of the output transistor provided in the embodiments of the present disclosure may be three or four times the width-to-length ratios of the conductive channels of other transistors, which is not limited in the embodiments of the present disclosure. Compared with the case that the width-to-length ratio of the conductive channel of the output transistor is ten times the width-to-length ratios of the conductive channels of other transistors in the shift register unit in the related art, the width-to-length ratio of the conductive channel of the output transistor in the output circuit of the shift register unit provided in the embodiments of the present disclosure is relatively small.

In the embodiments of the present disclosure, referring to the above Formula (1), it can be known that the power consumption generated by the shift register unit is also directly proportional to the parasitic capacitance C1 of the output transistor, and the parasitic capacitance C1 is directly proportional to the width-to-length ratio of the conductive channel of the output transistor, that is, the larger the width-to-length ratio of the conductive channel of the output transistor is, the larger the parasitic capacitance C1 is, and the smaller the width-to-length ratio of the conductive channel of the output transistor is, the smaller the parasitic capacitance C1 is. Therefore, by adopting the output transistor of which the conductive channel has a relatively small width-to-length ratio, that is, the first output transistor T1 and the second output transistor T2 which have relatively small parasitic capacitance C1, the power consumption generated by the shift register unit can be further effectively reduced.

Optionally, the first control signal terminal CN1 may be a second clock signal terminal CLK2, and the second control signal terminal CN2 may be a third clock signal terminal CLK3.

Moreover, the second clock signal terminal CLK2, the third clock signal terminal CLK3, and the first clock signal terminal CLK1 may have the same frequency, and may also have the same duty ratio (for example, the duty ratio may be one quarter). In each clock cycle, the third clock signal terminal CLK3, the first clock signal terminal CLK1, and the second clock signal terminal CLK2 may sequentially output a clock signal at the first potential.

The above embodiments are described by taking an example in which the transistors in the shift register unit are N-type transistors and the first potential is a high potential relative to the second potential. Of course, the transistors in the shift register unit may also be P-type transistors. When the transistors are P-type transistors, the first potential may be a low potential relative to the second potential.

In summary, the embodiments of the present disclosure provides a shift register unit. The shift register unit includes an input circuit, an output circuit, and a first pull-down circuit. The output circuit is coupled to the first DC power supply terminal, and the signal output by the output circuit to the output terminal is the first power supply signal provided by the first DC power supply terminal. As the signal frequency of the first power supply signal provided by the first DC power supply terminal is 0, and the power consumption generated by the shift register unit is directly proportional to the frequency of the signal output by the output circuit to the output terminal, the power consumption generated by the shift register unit can be effectively reduced by coupling the output circuit to the first DC power supply terminal.

Figure 8:
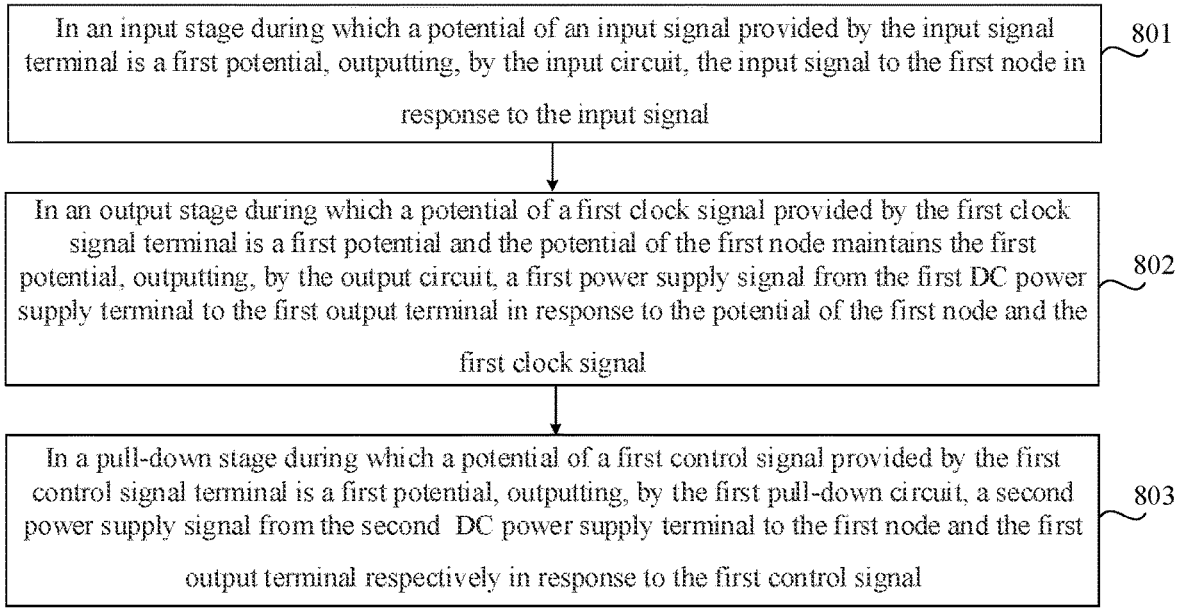
FIG. 8 is a flowchart of a method for driving a shift register unit according to an embodiment of the present disclosure.

FIG. 8 is a flowchart of a method or driving a shift register unit according to an embodiment of the present disclosure. The method may be applied to the shift register unit as shown in any of FIG. 1 to FIG. 7. As shown in FIG. 8, the method may include the following steps.

In step 801, in an input stage, the potential of the input signal provided by the input signal terminal is a first potential, and the input circuit outputs the input signal to the first node in response to the input signal.

In step 802, in an output stage, the potential of the first clock signal provided by the first clock signal terminal is the first potential, the potential of the first node maintains at the first potential, and the output circuit outputs a first power supply signal from the first DC power supply terminal to the first output terminal in response to the potential of the first node and the first clock signal.

In step 803, in a pull-down stage, the potential of the first control signal provided by the first control signal terminal is the first potential, and the first pull-down circuit outputs the second power supply signal to the first node and the first output terminal responsively in response to the first control signal.

In summary, the embodiment of the present disclosure provides a method for driving a shift register unit. The output circuit included in the shift register unit may output the first power supply signal provided by the first DC power supply terminal to the output terminal under the control of the potential of the first node and the first clock signal. Since the signal frequency of the first power supply signal provided by the first DC power supply terminal is 0, and the power consumption generated by the shift register unit is directly proportional to the frequency of the signal output by the output circuit to the output terminal, the power consumption generated by the shift register unit can be effectively reduced by outputting a signal of which the frequency is 0 to the output terminal.

Optionally, as shown in FIG. 3 to FIG. 7, the output circuit 20 may further be coupled to the second output terminal OUT2. Correspondingly, in the above step 802, that is, in the output stage, the output circuit 20 may further output the first power supply signal to the second output terminal OUT2 in response to the first node P1 and the first clock signal.

Correspondingly, in the above step 803, that is, in the pull-down stage, the first pull-down circuit 30 may further output the second power supply signal to the second output terminal OUT2 in response to the first control signal.

Optionally, as shown in FIG. 6 and FIG. 7, the input circuit 20 may further be coupled to the second control signal terminal CN2. The shift register unit may further include: a third pull-down circuit 50. The third pull-down circuit 50 may be coupled to the second control signal terminal CN2, the second DC power supply terminal VGL, the first output terminal OUT1 and the second output terminal OUT2 respectively.

Correspondingly, in the above step 801, that is, in the input stage, the input circuit 20 may output the input signal to the first node P1 in response to the second control signal provided by the second control signal terminal CN2. The third pull-down circuit 50 may output the second power supply signal to the first output terminal OUT1 and the second output terminal OUT2 in response to the second control signal.

In the embodiments of the present disclosure, the third pull-down circuit 50 may output the second power supply signal at the second potential to the two output terminals respectively when the potential of the second control signal is the first potential. The second potential is an ineffective potential. Therefore, the problem that the potential of the first output terminal OUT1 may change with the potential of the first node P1 when the input circuit 10 outputs the input signal to the first node P1 under the control of the second control signal can be avoided, thereby ensuring the operating stability of the shift register unit.

Optionally, as shown in FIG. 4 to FIG. 7, the shift register unit may further include: a second pull-down circuit 40. The second pull-down circuit 40 may be coupled to the first clock signal terminal CLK1, the second DC power source terminal VGL, and the third node P3 respectively. Correspondingly, in the above step 802, that is, in the output stage, the second pull-down circuit 40 may output the second power supply signal to the third node P3 in response to the first clock signal.

In the embodiments of the present disclosure, the second input transistor M2 is in a diode connection manner. When the potential of the first clock signal is the first potential, that is, when the output circuit 20 operates, the second pull-down circuit 40 can output the second power supply signal at the second potential to the third node P3, to implement noise reduction for the third node P3. Therefore, the problem that the potential of the first node P1 flows backward to the third node P3, to cause turn-on of the second input transistor M2 by mistake after the output circuit 20 pulls up the potential of the first node P1 according to the potential of the first output terminal OUT1 can be avoided, thereby ensuring the operating stability of the shift register unit.

Optionally, in the embodiments of the present disclosure, as shown in FIG. 2 to FIG. 7, the adjusting circuit 20 may include: an adjusting sub-circuit 201 and an output sub-circuit 202. The adjusting sub-circuit 201 may be coupled to the second clock signal terminal CLK2, the first output terminal OUT1, the first node P1 and the second node P2 respectively. The output sub-circuit 201 may be coupled to the second node P2, the first DC power supply terminal VGH, the first output terminal OUT1 and the second output terminal OUT2 respectively.

Correspondingly, the first pull-down circuit 30 may further be coupled to the second node P2. In the above step 803, that is, in the pull-down stage, the first pull-down circuit 30 may further output the second power supply signal at the second potential to the second node P2 in response to the first control signal, thereby implementing noise reduction for the second node P2.

The driving principle of the shift register unit provided in the embodiments of the present disclosure is described in detail by taking the shift register unit shown in FIG. 7 as an example, and by taking an example in which the transistors in the shift register unit are N-type transistors, the first potential is a high potential relative to the second potential, the first control signal terminal CN1 is the second clock signal terminal CLK2 and the second control signal terminal CN2 is the third clock signal terminal CLK3.

Figure 9:
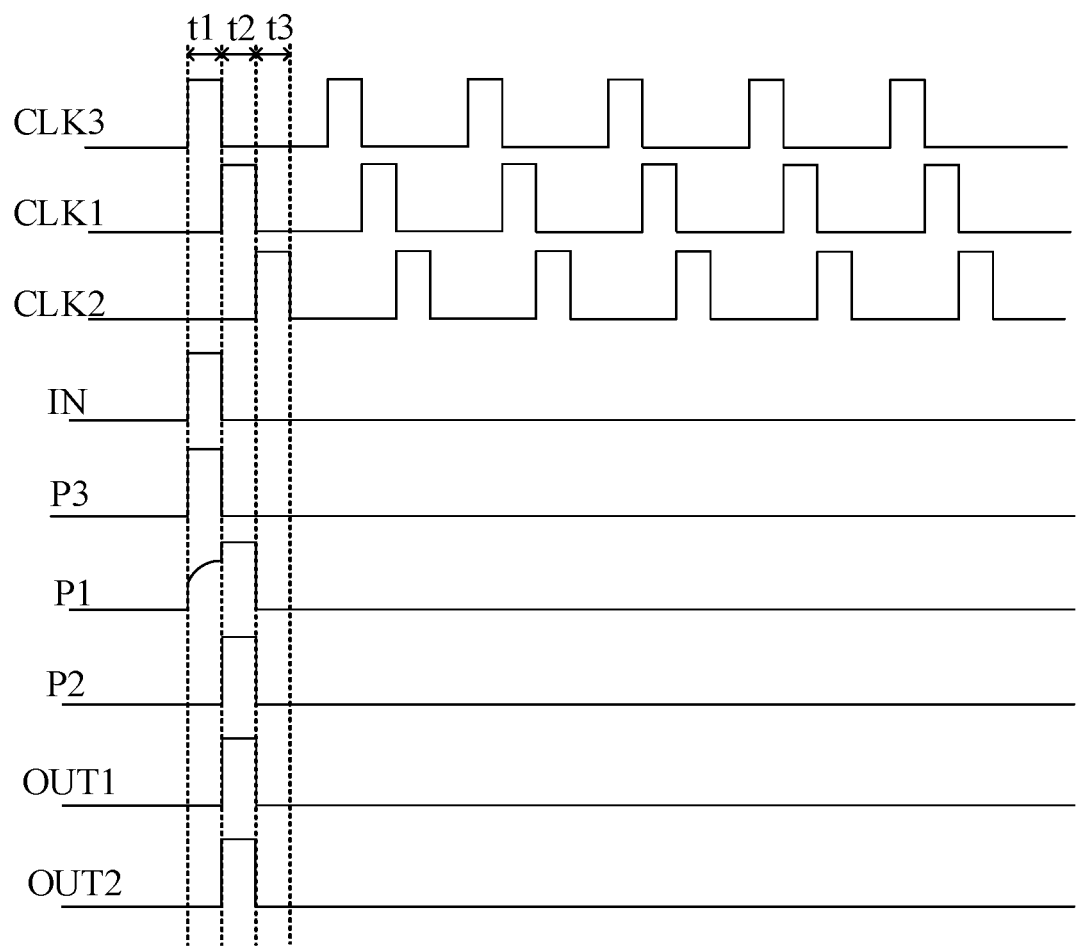
FIG. 9 is a diagram showing timing sequences of respective signal terminals of a shift register unit according to an embodiment of the present disclosure.

FIG. 9 is a diagram showing timing sequences of output signals from respective signal terminals in a shift register unit according to an embodiment of the present disclosure. As shown in FIG. 9, in the input stage t1, the potential of the input signal provided by the input signal terminal IN is the first potential, and the potential of the third clock signal provided by the third clock signal terminal CLK3 is the first potential. The first input transistor M1, the sixth pull-down transistor L6, and the seventh pull-down transistor L7 are all turned on. The input signal terminal IN outputs the input signal at the first potential to the third node P3 via the first input transistor M1, and the second input transistor M2 is turned on. The third node P3 outputs the input signal at the first potential to the first node P1 via the second input transistor M2, thereby implementing pre-charging of the first node P1.

Moreover, in the input phase t1, the sixth pull-down transistor L6 and the seventh pull-down transistor L7 are both turned on. Therefore, the second DC power supply terminal VGL can output the second power supply signal at the second potential to the first output terminal OUT1 via the sixth pull-down transistor L6, and can output the second power supply signal at the second potential to the second output terminal OUT2 via the seventh pull-down transistor L7, thereby implementing noise reduction for the first output terminal OUT1 and the second output terminal OUT2.

In the embodiments of the present disclosure, referring to FIG. 3 to FIG. 7, it can be known that the first node P1 is coupled to the first output terminal OUT1 via the capacitor C0. When the second input transistor M2 outputs the input signal at the first potential to the first node P1, the potential of the first output terminal OUT1 may be pulled up due to the coupling action of the capacitor C0. Therefore, by disposing the sixth pull-down transistor L6 to perform noise reduction for the first output terminal OUT1, the problem that the potential of the first output terminal OUT1 is pulled up can be avoided, and the stability of the potential of the first output terminal OUT1 is ensured, thereby ensuring the operating stability of the shift register unit.

In the output stage t2, the potential of the first clock signal provided by the first clock signal terminal CLK1 is the first potential, and the switching transistor K1 and the fifth pull-down transistor L5 are turned on. The potential of the first node P1 maintains at the first potential, the first node P1 outputs a signal at the first potential to the second node P2 via the switching transistor K1, and the first output transistor T1 and the second output transistor T2 are turned on. The first DC power supply terminal VGH outputs the first power supply signal at the first potential to the first output terminal OUT1 via the first output transistor T1, and outputs the first power supply signal at the first potential to the first output terminal OUT1 via the second output transistor T2.

The first output terminal OUT1 is coupled to the input signal terminal IN of the next level of shift register unit, and the second output terminal OUT2 is coupled to a gate line. Therefore, in this case, the first output terminal OUT1 can output the first power supply signal to the input signal terminal IN of the next level of shift register unit, thereby driving the next level of shift register unit to operate. The second output terminal OUT2 can output the first power supply signal to a gate line coupled thereto, thereby providing a gate drive signal for the pixel coupled to the gate line.

Further, the capacitor C0 is coupled between the first node P1 and the first output terminal OUT1. Therefore, in the output stage t2, the potential of the first node P1 can be further pulled up under the coupling action of the capacitor C0, and the pulled-up potential of the first node P1 can be output to the second node P2 via the switching transistor K. In this case, the first output transistor T1 and the second output transistor T2 can be fully turned on, and the first DC power supply terminal VGH can output the first power supply signal to the second node P2 via the first output transistor T1 in a full swing amplitude.

In the output stage t2, M2 is in the diode connection manner. Therefore, the fifth pull-down transistor L5 is turned on, so that the second DC power supply terminal VGL can output the second power supply signal at the second potential to the third node P3, to implement noise reduction for the third node P3. Thus, the problem that the potential of the first node P1 flows backward to the third node P3, to cause turn-on of the second input transistor M2 by mistake after the output circuit 20 pulls up the potential of the first node P1 according to the potential of the first output terminal OUT1 can be avoided, thereby ensuring the operating stability of the shift register unit.

Moreover, in the embodiments of the present disclosure, the switching transistor K1 can continuously output signals at the first potential to the second node P2, that is, continuously charge the second node P2 until the switching transistor K1 is in an off state. That is, when the switching transistor K1 is in the off state, the switching transistor K1 stops charging the second node P2. When the switching transistor K1 is in the off state, the gate-source voltage difference Vgs meets: Vgs=Vclk1−Vp2=Vth. Here, Vclk1 is a voltage value of the first clock signal terminal CLK1 coupled to the switching transistor K1, Vp2 is a voltage value of the second node P2, and Vth is a threshold voltage of the switching transistor K1.

It is assumed that the Vth of the switching transistor K1 is constant, then the larger Vclk1 is, the larger Vp2 is, and the smaller Vclk1 is, the smaller Vp2 is. That is, Vclk1 determines Vp2. Therefore, in the embodiments of the present disclosure, the potential of the second node P2 can be increased by enabling the first clock signal terminal CLK1 to provide the first clock signal having a relatively large voltage amplitude, to ensure that the first output transistor T1 and the second output transistor T2 can be fully turned on, and the first DC power supply terminal VGH can output the first power supply signal to the first output terminal OUT1 and the second output terminal OUT2 via the first output transistor T1 and the second output transistor T2 in a full swing amplitude.

In the pull-down stage t3, the potential of the second clock signal provided by the second clock signal terminal CLK2 is the first potential, and the first pull-down transistor L1, the second pull-down transistor L2, the third pull-down transistor L3, and the fourth pull-down Transistor L4 are all turned on.

The second DC power supply terminal VGL outputs the second power supply signal at the second potential to the first node P1 via the first pull-down transistor L1, thereby implementing noise reduction for the first node P1. The second DC power supply terminal VGL outputs the second power supply signal at the second potential to the first output terminal OUT1 via the second pull-down transistor L2, thereby implementing noise reduction for the first output terminal OUT1. The second DC power supply terminal VGL outputs the second power supply signal at the second potential to the second node P2 via the third pull-down transistor L3, thereby implementing noise reduction for the second node P2. The second DC power supply terminal VGL outputs the second power supply signal at the second potential to the second output terminal OUT2 via the fourth pull-down transistor L4, thereby implementing noise reduction for the second output terminal OUT2.

The above embodiments are described by taking an example in which the transistors in the shift register unit are N-type transistors and the first potential is a high potential relative to the second potential. Of course, the transistors in the shift register unit may also be P-type transistors. When the transistors are P-type transistors, the first potential may be a low potential relative to the second potential.

In summary, the embodiment of the present disclosure provides a method for driving a shift register unit. The output circuit included in the shift register unit can output the first power supply signal provided by the first DC power supply terminal to the output terminal under the control of the potential of the first node and the first clock signal. As the signal frequency of the first power supply signal provided by the first DC power supply terminal is 0, and the power consumption generated by the shift register unit is directly proportional to the frequency of the signal output by the output circuit to the output terminal, the power consumption generated by the shift register unit can be effectively reduced by outputting a signal of which the frequency is 0 to the output terminal.

Figure 10:
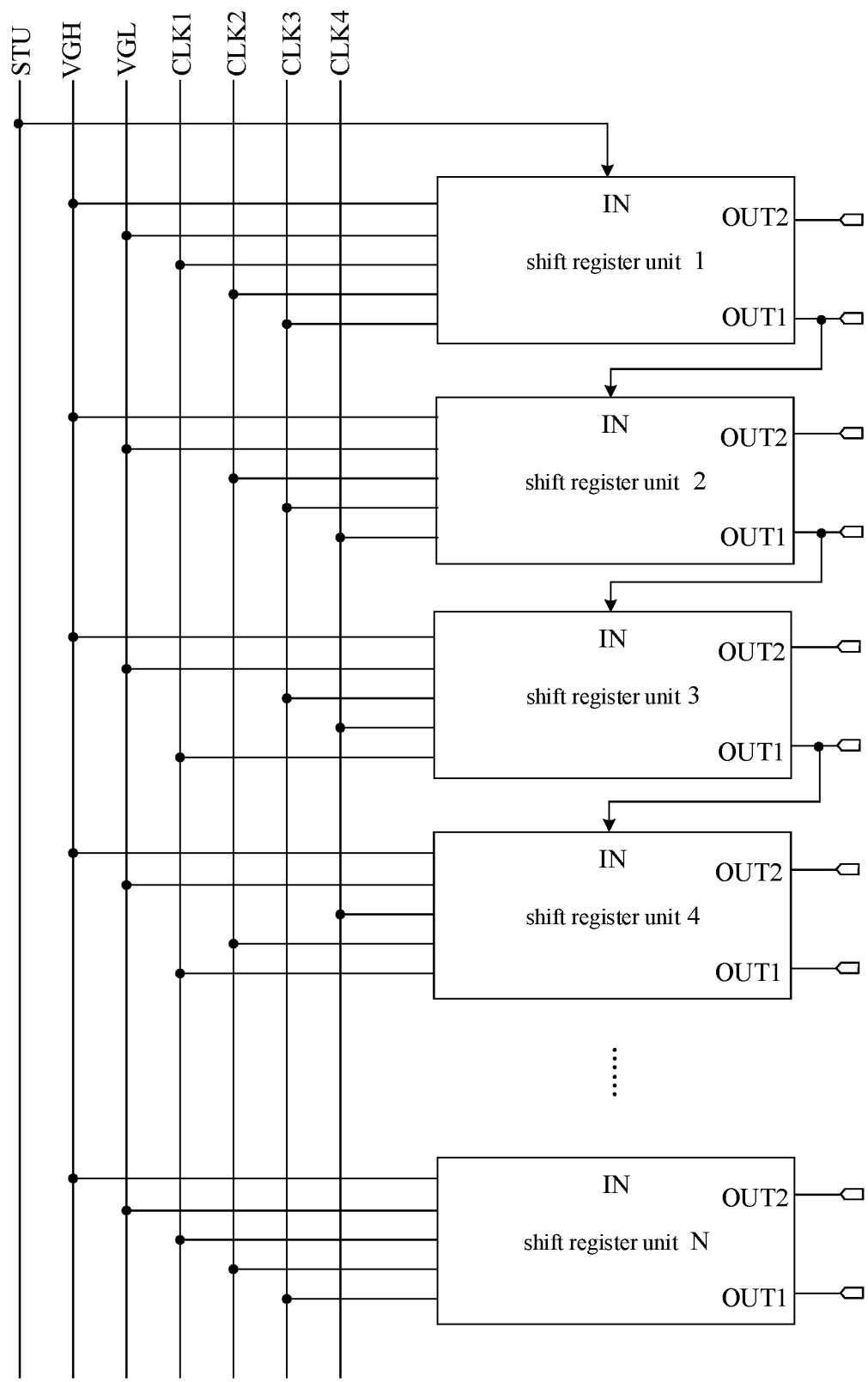
FIG. 10 is a schematic structural diagram of a gate drive circuit according to an embodiment of the present disclosure.

FIG. 10 is a schematic structural diagram of a gate drive circuit according to an embodiment of the present disclosure. As shown in FIG. 10, the gate drive circuit may include at least two cascaded shift register units. For example, FIG. 10 shows N cascaded shift register units. N is a positive integer greater than four. Each of the shift register units may be the shift register unit as shown in any of FIG. 1 to FIG. 7.

Referring to FIG. 10, it can be seen that the first output terminal OUT1 of each level of shift register unit may be coupled to the input signal terminal IN of the next level of shift register unit, thereby implementing the shift function of the gate drive circuit. The second output terminal OUT2 of each level of shift register unit may be coupled to a gate line (not shown in FIG. 10), thereby implementing the function of providing a gate signal to the gate line.

Optionally, referring to FIG. 10, the input signal terminal IN of the first level of shift register unit may be coupled to a turn-on signal terminal STU, and each level of shift register unit may also be coupled to the first DC power supply terminal VGH and the second DC power supply terminal VGL. The first control signal terminal may be a second clock signal terminal CLK2, and the second control signal terminal CN2 may be a third clock signal terminal CLK3. Correspondingly, four clock signal terminals CLK1, CLK2, CLK3 and CLK4 may be disposed in the gate drive circuit, that is, the gate drive circuit may adopt a four-phase clock. In the plurality of cascaded shift register units included in the gate drive circuit, each shift register unit may be coupled to three of the four clock signal terminals.

For example, referring to FIG. 10, the first level of shift register unit may be coupled to the clock signal terminal CLK1, the clock signal terminal CLK2, and the clock signal terminal CLK3. The second level of shift register unit may be coupled to the clock signal terminal CLK2, the clock signal terminal CLK3 and the clock signal terminal CLK4. The third level of shift register unit may be coupled to the clock signal terminal CLK3, the clock signal terminal CLK4 and the clock signal terminal CLK1. The fourth level of shift register unit may be coupled to the clock signal terminal CLK4, the clock signal terminal CLK1 and the clock signal terminal CLK2, and so on.

Figure 11:
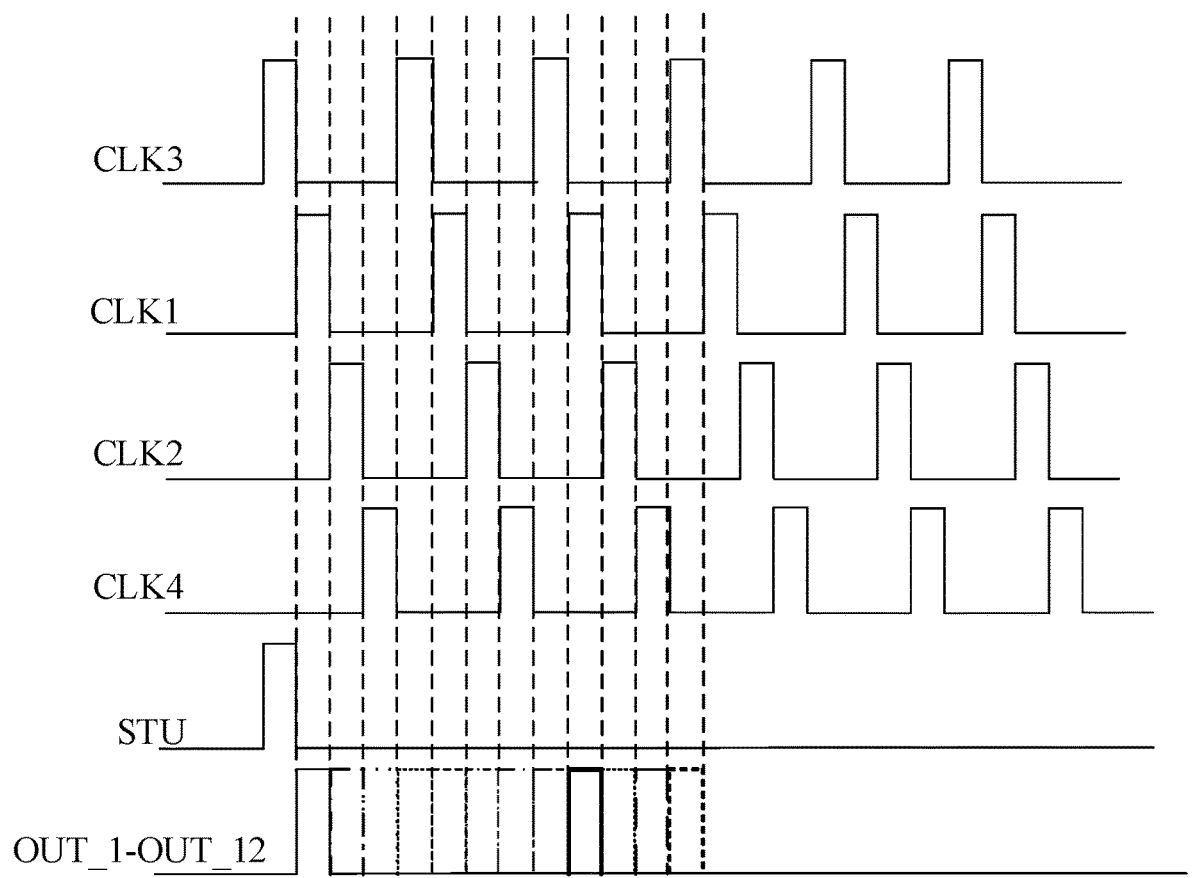
FIG. 11 is a diagram showing timing sequences of respective signal terminals in a gate drive circuit according to an embodiment of the present disclosure.

Optionally, FIG. 11 is a diagram showing timing sequences of respective signal terminals in a gate drive circuit according to an embodiment of the present disclosure. FIG. 11 shows a diagram showing timing sequences of respective clock signal terminals in a gate drive circuit including twelve levels of cascaded shift register units, a timing sequence of the turn-on signal terminal STU, and timing sequences from the output terminal OUT_1 (the output terminal may be any one of the first output terminal OUT1 and the second output terminal OUT2) of the first level of shift register unit to the output terminal OUT_12 (the output terminal may also be any one of the first output terminal OUT1 and the second output terminal OUT2) of the twelfth level of shift register unit. Referring to FIG. 11, it can be seen that the output terminals of the twelve levels of shift register units can sequentially output the clock signal at the first potential. The driving principle for each level of shift register unit may be made reference to the driving principle described above, which is not repeated in the embodiment of the present disclosure.

Referring to FIG. 11, it can be seen that the gate drive circuit includes four clock signal terminals CLK1, CLK2, CLK3, and CLK4, and the clock signals provided by the four clock signal terminals CLK1, CLK2, CLK3, and CLK4 have the same signal frequency and the same duty ratio. The duty ratio of the clock signal provided by each clock signal terminal is one quarter. In each clock cycle, the clock signal terminals CLK3, CLK1, CLK2, and CLK4 sequentially provide the clock signals at the first potential.

Optionally, the voltage change range of the clock signals provided by the clock signal terminal CLK1, the clock signal terminal CLK2, the clock signal terminal CLK3, and the clock signal terminal CLK4 may be: −12 volts (V) to 30V.

The voltage of the first power supply signal provided by the first DC power supply terminal VGH may be 20V, and the voltage of the second power supply signal provided by the second DC power supply terminal VGL may be −12V.

The embodiments of the present disclosure further provide a display device that may include the gate drive circuit as shown in FIG. 10. The display device may be any product or component having a display function, such as a liquid crystal panel, a piece of electronic paper, an OLED panel, an AMOLED panel, a mobile phone, a tablet computer, a television, a display, a notebook computer, a digital photo frame and a navigator.

It will be clearly understood by those skilled in the art that for the convenience and brevity of the description, the specific working process of the above shift register unit and circuits may be made reference to the corresponding processes in the foregoing method embodiments, and details are not repeated here.

The foregoing descriptions are merely exemplary embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A shift register unit, comprising: an input circuit, an output circuit, and a first pull-down circuit;
   wherein the input circuit is coupled to an input signal terminal and a first node respectively, and the input circuit is configured to output an input signal from the input signal terminal to the first node;
   the output circuit is coupled to a first clock signal terminal, the first node, a first DC power supply terminal and a first output terminal respectively, and the output circuit is configured to output a first power supply signal from the first DC power supply terminal to the first output terminal in response to the input signal of the first node and a first clock signal provided by the first clock signal terminal; and
   the first pull-down circuit is coupled to a first control signal terminal, a second DC power supply terminal, the first output terminal, and the first node respectively, and the first pull-down circuit is configured to output a second power supply signal from the second DC power supply terminal to the first output terminal and the first node respectively in response to a first control signal provided by the first control signal terminal.

2. The shift register unit according to claim 1, wherein the output circuit comprises: an adjusting sub-circuit and an output sub-circuit;
   wherein the adjusting sub-circuit is coupled to the first clock signal terminal, the first output terminal, the first node and a second node respectively, and the adjusting sub-circuit is configured to adjust the potential of the first node according to a potential of the first output terminal, and adjust a potential of the second node according to the potential of the first node in response to the first clock signal; and
   the output sub-circuit is coupled to the second node, the first DC power supply terminal and the first output terminal respectively, and the output sub-circuit is configured to output the first power supply signal to the first output terminal in response to a potential of the second node.

3. The shift register unit according to claim 2, wherein the adjusting sub-circuit comprises: a switching transistor and a capacitor;

wherein a gate of the switching transistor is coupled to the first clock signal terminal, a first electrode of the switching transistor is coupled to the first node, and a second electrode of the switching transistor is coupled to the second node; and one terminal of the capacitor is coupled to the first node, and another terminal of the capacitor is coupled to the first output terminal.

4. The shift register unit according to claim 2, wherein the output sub-circuit comprises: a first output transistor;

wherein a gate of the first output transistor is coupled to the second node, a first electrode of the first output transistor is coupled to the first DC power supply terminal, and a second electrode of the first output transistor is coupled to the first output terminal.

5. The shift register unit according to claim 4, wherein the output circuit is further coupled to a second output terminal, and the output sub-circuit further comprises: a second output transistor;

wherein a gate of the second output transistor is coupled to the second node, a first electrode of the second output transistor is coupled to the first DC power supply terminal, and a second electrode of the second output transistor is coupled to the second output terminal.

6. The shift register unit according to claim 2, wherein a width-to-length ratio of a conductive channel of a transistor in the output sub-circuit is three to five times width-to-length ratios of conductive channels of transistors in the input circuit, the adjusting sub-circuit and the first pull-down circuit.

7. The shift register unit according to claim 1, wherein the first pull-down circuit comprises: a first pull-down transistor and a second pull-down transistor;

wherein a gate of the first pull-down transistor and a gate of the second pull-down transistor are both coupled to the first control signal terminal;

a first electrode of the first pull-down transistor and a first electrode of the second pull-down transistor are both coupled to the second DC power supply terminal; and a second electrode of the first pull-down transistor is coupled to the first node, and a second electrode of the second pull-down transistor is coupled to the first output terminal.

8. The shift register unit according to claim 2, wherein the first pull-down circuit is further coupled to the second node, and the first pull-down circuit is further configured to output the second power supply signal to the second node in response to the first control signal.

9. The shift register unit according to claim 8, wherein the output sub-circuit is further coupled to a second output terminal; the first pull-down circuit comprises: a first pull-down transistor, a second pull-down transistor, a third pull-down transistor and a fourth pull-down transistor;

wherein a gate of the first pull-down transistor, a gate of the second pull-down transistor, a gate of the third pull-down transistor, and a gate of the fourth pull-down transistor are all coupled to the first control signal terminal;

a first electrode of the first pull-down transistor, a first electrode of the second pull-down transistor, a first electrode of the third pull-down transistor, and a first electrode of the fourth pull-down transistor are all coupled to the second DC power supply terminal; and a second electrode of the first pull-down transistor is coupled to the first node, a second electrode of the second pull-down transistor is coupled to the first output terminal, a second electrode of the third pull-down transistor is coupled to the second node, and a second electrode of the fourth pull-down transistor is coupled to the second output terminal.

10. The shift register unit according to claim 1, wherein the input circuit comprises: a first input sub-circuit and a second input sub-circuit;

wherein the first input sub-circuit is coupled to the input signal terminal and a third node respectively, and the first input sub-circuit is configured to output the input signal to the third node in response to the input signal from the input signal terminal; and the second input sub-circuit is coupled to the third node and the first node respectively, and the second input sub-circuit is configured to output a potential of the third node to the first node in response to the potential of the third node.

11. The shift register unit according to claim 10, wherein the first input sub-circuit comprises: a first input transistor; and the second input sub-circuit comprises: a second input transistor;

wherein a gate and a first electrode of the first input transistor are both coupled to the input signal terminal, and a second electrode of the first input transistor is coupled to the third node; and a gate and a first electrode of the second input transistor are both coupled to the third node, and a second electrode of the second input transistor is coupled to the first node.

12. The shift register unit according to claim 10, further comprising: a second pull-down circuit;

wherein the second pull-down circuit is coupled to the first clock signal terminal, the second DC power supply terminal, and the third node respectively, and the second pull-down circuit is configured to output the second power supply signal to the third node in response to the first clock signal.

13. The shift register unit according to claim 12, wherein the second pull-down circuit comprises: a fifth pull-down transistor;

wherein a gate of the fifth pull-down transistor is coupled to the first clock signal terminal, a first electrode of the fifth pull-down transistor is coupled to the second DC power supply terminal, and a second electrode of the fifth pull-down transistor is coupled to the third node.

14. The shift register unit according to claim 1, wherein the input circuit is further coupled to a second control signal terminal, and the input circuit is configured to output the input signal to the first node in response to a second control signal provided by the second control signal terminal;

the shift register unit further comprises: a third pull-down circuit;

wherein the third pull-down circuit is coupled to the second control signal terminal, the second DC power supply terminal, and the first output terminal respectively; and the third pull-down circuit is configured to output the second power supply signal to the first output terminal in response to the second control signal.

15. The shift register unit according to claim 14, wherein the output circuit is further coupled to a second output terminal; and the third pull-down circuit comprises: a sixth pull-down transistor and a seventh pull-down transistor;

wherein a gate of the sixth pull-down transistor and a gate of the seventh pull-down transistor are both coupled to the second control signal terminal;

a first electrode of the sixth pull-down transistor and a first electrode of the seventh pull-down transistor are both coupled to the second DC power supply terminal; and a second electrode of the sixth pull-down transistor is coupled to the first output terminal, and a second electrode of the seventh pull-down transistor is coupled to the second output terminal.

16. The shift register unit according to claim 14, wherein the first control signal terminal is a second clock signal terminal, and the second control signal terminal is a third clock signal terminal.

17. The shift register unit according to claim 9, further comprising: a second pull-down circuit and a third pull-down circuit; the input circuit is further coupled to a second control signal terminal, the input circuit comprises: a first input sub-circuit and a second input sub-circuit, wherein the first input sub-circuit comprises: a first input transistor, and the second input sub-circuit comprises: a second input transistor; the output circuit is further coupled to a second output terminal, and the output circuit comprises: an adjusting sub-circuit and an output sub-circuit, wherein the adjusting sub-circuit comprises: a switching transistor and a capacitor, and the output sub-circuit comprises: a first output transistor and a second output transistor; the second pull-down circuit comprises: a fifth pull-down transistor; and the third pull-down circuit comprises: a sixth pull-down transistor and a seventh pull-down transistor;

wherein a gate of the first input transistor is coupled to the second control signal terminal, a first electrode of the first input transistor is coupled to the input signal terminal, and a second electrode of the first input transistor is coupled to a third node;

a gate and a first electrode of the second input transistor are both coupled to the third node, and a second electrode of the second input transistor is coupled to the first node;

a gate of the switching transistor is coupled to the first clock signal terminal, a first electrode of the switching transistor is coupled to the first node, and a second electrode of the switching transistor is coupled to the second node;

one terminal of the capacitor is coupled to the first node, and another terminal of the capacitor is coupled to the first output terminal;

a gate of the first output transistor is coupled to the second node, a first electrode of the first output transistor is coupled to the first DC power supply terminal, and a second electrode of the first output transistor is coupled to the first output terminal;

a gate of the second output transistor is coupled to the second node, a first electrode of the second output transistor is coupled to the first DC power supply terminal, and a second electrode of the second output transistor is coupled to the second output terminal;

a gate of the fifth pull-down transistor is coupled to the first clock signal terminal, a first electrode of the fifth pull-down transistor is coupled to the second DC power supply terminal, and a second electrode of the fifth pull-down transistor is coupled to the third node;

a gate of the sixth pull-down transistor and a gate of the seventh pull-down transistor are both coupled to the second control signal terminal, and a first electrode of the sixth pull-down transistor and a first electrode of the seventh pull-down transistor are both coupled to the second DC power supply terminal; and a second electrode of the sixth pull-down transistor is coupled to the first output terminal, and a second electrode of the seventh pull-down transistor is coupled to the second output terminal;

wherein, the first control signal terminal is a second clock signal terminal, and the second control signal terminal is a third clock signal terminal; transistors in the input circuit, the adjusting sub-circuit, the output sub-circuit, and the first pull-down circuit are all N-type transistors; and a width-to-length ratio of a conductive channel of a transistor in the output sub-circuit is three to five times width-to-length ratios of conductive channels of transistors in the input circuit, the adjusting sub-circuit and the first pull-down circuit.

18. A method for driving a shift register unit, wherein the shift register unit comprises: an input circuit, an output circuit, and a first pull-down circuit; the input circuit is coupled to an input signal terminal and a first node respectively, the output circuit is coupled to a first clock signal terminal, the first node, a first DC power supply terminal, and a first output terminal respectively, and the first pull-down circuit is coupled to a first control signal terminal, a second DC power supply terminal, the first output terminal and the first node respectively; the method comprising:

in an input stage during which a potential of an input signal provided by the input signal terminal is a first potential, outputting, by the input circuit, the input signal to the first node in response to the input signal;

in an output stage during which a potential of a first clock signal provided by the first clock signal terminal is a first potential and the input signal of the first node maintains the first potential, outputting, by the output circuit, a first power supply signal from the first DC power supply terminal to the first output terminal in response to the potential of the first node and the first clock signal; and in a pull-down stage during which a potential of a first control signal provided by the first control signal terminal is a first potential, outputting, by the first pull-down circuit, a second power supply signal from the second DC power supply terminal to the first node and the first output terminal respectively in response to the first control signal.

19. A gate drive circuit, comprising: at least two cascaded shift register units; wherein each level of shift register unit comprises: an input circuit, an output circuit, and a first pull-down circuit;

wherein the input circuit is coupled to an input signal terminal and a first node respectively, and the input circuit is configured to output an input signal from the input signal terminal to a first node;

the output circuit is coupled to a first clock signal terminal, the first node, a first DC power supply terminal and a first output terminal respectively, and the output circuit is configured to output a first power supply signal from the first DC power supply terminal to the first output terminal in response to the input signal of the first node and a first clock signal provided by the first clock signal terminal; and the first pull-down circuit is coupled to a first control signal terminal, a second DC power supply terminal, the first output terminal, and the first node respectively, and the first pull-down circuit is configured to output a second power supply signal from the second DC power supply terminal to the first output terminal and the first node respectively in response to a first control signal provided by the first control signal terminal.

20. A display device, comprising: the gate drive circuit according to claim 19.

\* \* \* \* \*